US 6,815,276 B2

(12) United States Patent
Hower et al.

(10) Patent No.: US 6,815,276 B2
(45) Date of Patent: Nov. 9, 2004

(54) SEGMENTED POWER MOSFET OF SAFE OPERATION (75) Inventors: Philip L. Hower, Concord, MA (US); John Lin, Chelmsford, MA (US); Sameer P. Pendharkar, Richardson, TX (US); Steven L. Merchant, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/264,038

(22) Filed: Oct. 3, 2002

(65) Prior Publication Data

US 2004/0067617 A1 Apr. 8, 2004

(51) Int. Cl.[7] .................. H01L 21/336; H01L 21/8234
(52) U.S. Cl. ........................................ 438/197; 438/294
(58) Field of Search ................................ 438/197–308; 257/327, 335–343

(56) References Cited

U.S. PATENT DOCUMENTS

| 4,042,947 A | 8/1977 | Chu et al. |
| 4,231,059 A | 10/1980 | Hower et al. |
| 5,311,148 A | 5/1994 | Pritchett .................. 330/295 |
| 5,736,766 A | 4/1998 | Efland et al. |
| 5,828,112 A * | 10/1998 | Yamaguchi .............. 257/378 |
| 6,372,586 B1 | 4/2002 | Efland et al. |

* cited by examiner

Primary Examiner—Long Pham
Assistant Examiner—Marcos D. Pizarro-Crespo
(74) Attorney, Agent, or Firm—Yingsheng Tung; Wade James Brady, III; Frederick J. Telecky, Jr.

(57) ABSTRACT

Segmented power transistors and fabrication methods are disclosed in which transistor segments are spaced from one another to facilitate thermal diffusion, and in which other electrical devices can be formed in the spaces between transistor segments.

9 Claims, 9 Drawing Sheets

FIG. 13

SEGMENTED POWER MOSFET OF SAFE OPERATION

FIELD OF INVENTION

The present invention relates generally to semiconductor devices and more particularly to segmented power MOSFET devices and methods for making the same.

BACKGROUND OF THE INVENTION

Many modern power semiconductor devices are fabricated using lateral double-diffused metal-oxide-semiconductor (LDMOS) transistors, sometimes referred to as lateral DMOS devices. LDMOS transistors are asymmetrical MOSFET devices, wherein a p-type channel region is diffused in a low-doped n-type drain region. Low doping on the drain side provides a large depletion layer with high blocking voltage. Moreover, the channel region diffusion can be defined with the same mask as the source region, resulting in a short channel with high current handling capabilities. Also, the relatively deep p-type diffusion causes a large radius of curvature, thereby mitigating edge effects and effectively lowering drain to source resistance when the device is turned on (Rdson). LDMOS devices often include a body contact at one end of the p-type diffusion to increase the device breakdown voltage and power handling capability.

Solenoid driver integrated circuits and other output drivers often include one or more such LDMOS power transistor devices along with logic and other lower power analog circuitry, wherein the LDMOS transistors are used to provide control outputs to solenoids in automotive or other applications. LDMOS devices have certain performance advantages in such applications, for example, such as relatively low Rdson and high blocking voltage capabilities. Thus, LDMOS devices have been widely used for integrated circuit output drivers requiring blocking voltages in the range of 20–60 volts, and a current capability in the range of about 1–3 amps or higher, although such LDMOS transistors may be employed in applications requiring other blocking voltages and current capabilities. In addition, LDMOS device fabrication is relatively easy to integrate into CMOS process flows. This allows easy integration in devices where logic, low power analog, or other circuitry is also to be fabricated in a single IC.

Figure 1A:
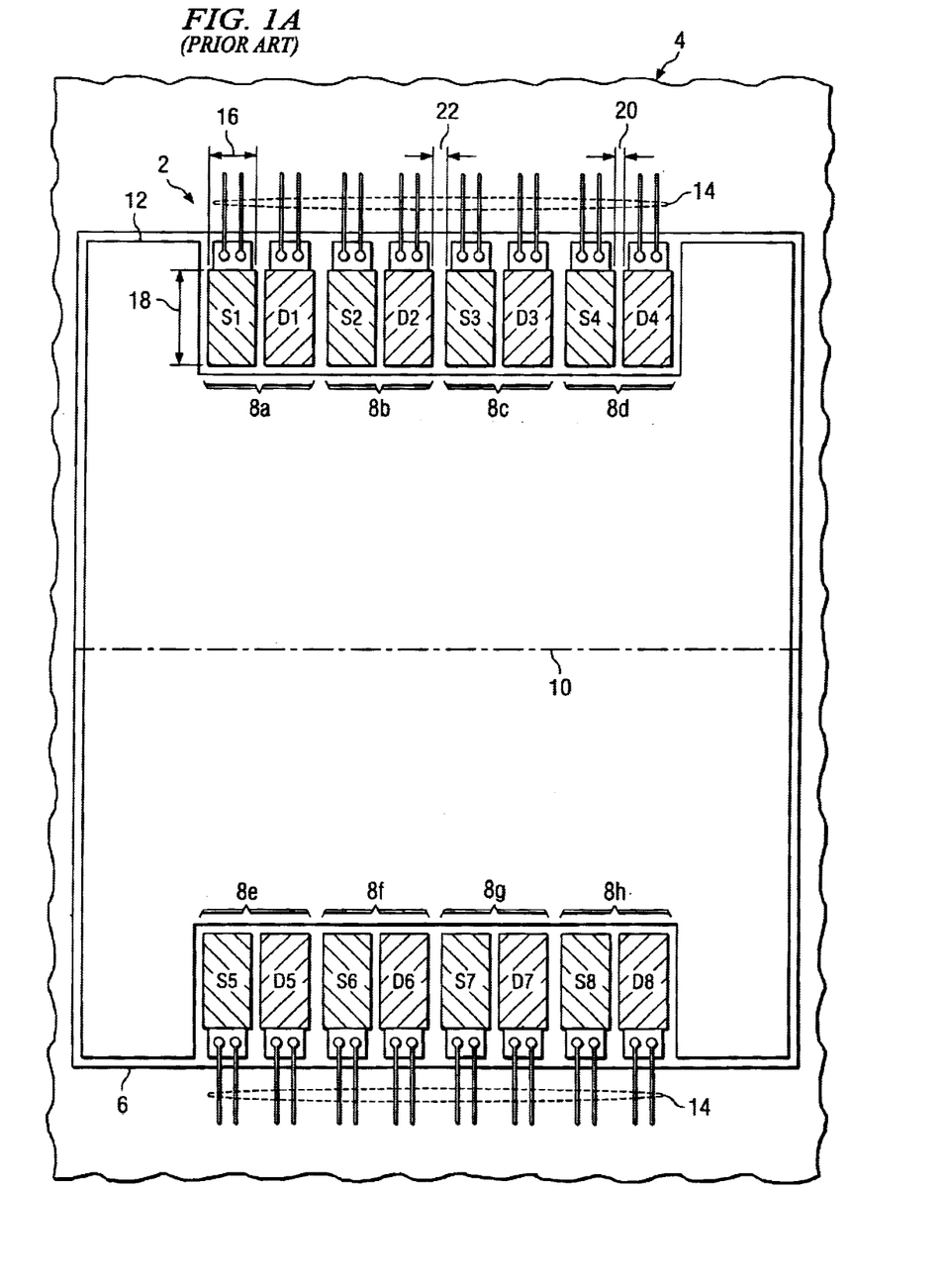
FIG. 1A is a top plan view illustrating a solenoid driver circuit having several single-segment power transistors.

FIG. 1A illustrates a portion of a wafer 4 in which a solenoid driver device 2 has been fabricated, at an intermediate stage of production with a top metalization or interconnect layer having been formed. The wafer 4 includes many such devices 2, each within a die boundary 6. The device 2 includes eight LDMOS transistors 8a–8h with four transistors 8a–8d at one end and the other four transistors 8e–8h at an opposite end on either side of the die center line 10, as well as other low power analog and digital logic circuitry (not shown) in the remaining portion 12 of the usable area within the die boundary 6. The transistors 8 individually comprise a source metalization region "S" and a drain metalization region "D", for example, wherein the transistor 8a includes a drain metalization region D1 and a source metalization region S1. Each of the transistors 8 also includes a gate (not shown). The drain metalization regions D and source metalization regions S of the transistors 8 are formed over partitioned source and drain diffusion regions (not shown) in the wafer 4, which are connected to the metalization features S and D in the illustrated top interconnect layer having lengths 16 and widths 18, which provide external connection to wiring structures 14.

The source metalization region S and the drain metalization region D of the individual LDMOS transistors 8 are separated by a distance 20, and the transistors 8 themselves are spaced from one another by a small distance 22, wherein the portion or area 12 in which other circuit devices are formed does not extend into the spacing 22 between adjacent power transistors 8. However, the close spacing 22 of the adjacent transistors 8 limits the amount of heat that can be removed from the transistors 8. As seen in FIG. 1A, lateral diffusion of heat from the partitioned source and drain regions beneath the source metalization region S1 is essentially inhibited in the direction toward the partitioned source and drain regions beneath the drain metalization region D1, and similarly, lateral thermal diffusion from the partitioned source and drain regions beneath the drain metalization region D4 is inhibited in the direction toward the source metalization region S4. Furthermore, the lateral diffusion of the inner partitioned source and drain regions beneath the source and drain metalization structures S2–S4 and D1–D3 is limited by the close adjacency thereof.

The safe operating area (SOA) of a power semiconductor device, such as the transistors 8 of the solenoid driver device 2, is a measure of the device's ability to turn off current to a reactive load, such as a solenoid, without thermal failure or degradation. For a larger device SOA, a larger inductive current can be turned off without damaging the device. For instance, when attempting to turn off drive current to an inductive load such as a solenoid, the voltage across the device is greatly increased while the inductive load prevents the current from decreasing to zero instantaneously. For capacitive loads, the current through the device is greatly increased while the load prevents the voltage from decreasing to zero instantaneously.

In the solenoid driver device 2, the SOA is a design limitation to be considered along with the desired Rdson for the transistors 8. Due to the close spacing 22 between adjacent transistors 8, the area of the transistors 8 must be made large enough to prevent thermal damage or degradation. In the device 2 of FIG. 1A, therefore, the area occupied by the individual LDMOS devices 8 (e.g., slightly more than 2 times the length 16 times the width 18) is larger than necessary to meet a given Rdson specification, in order to prevent thermal failure during operation.

Figure 1B:
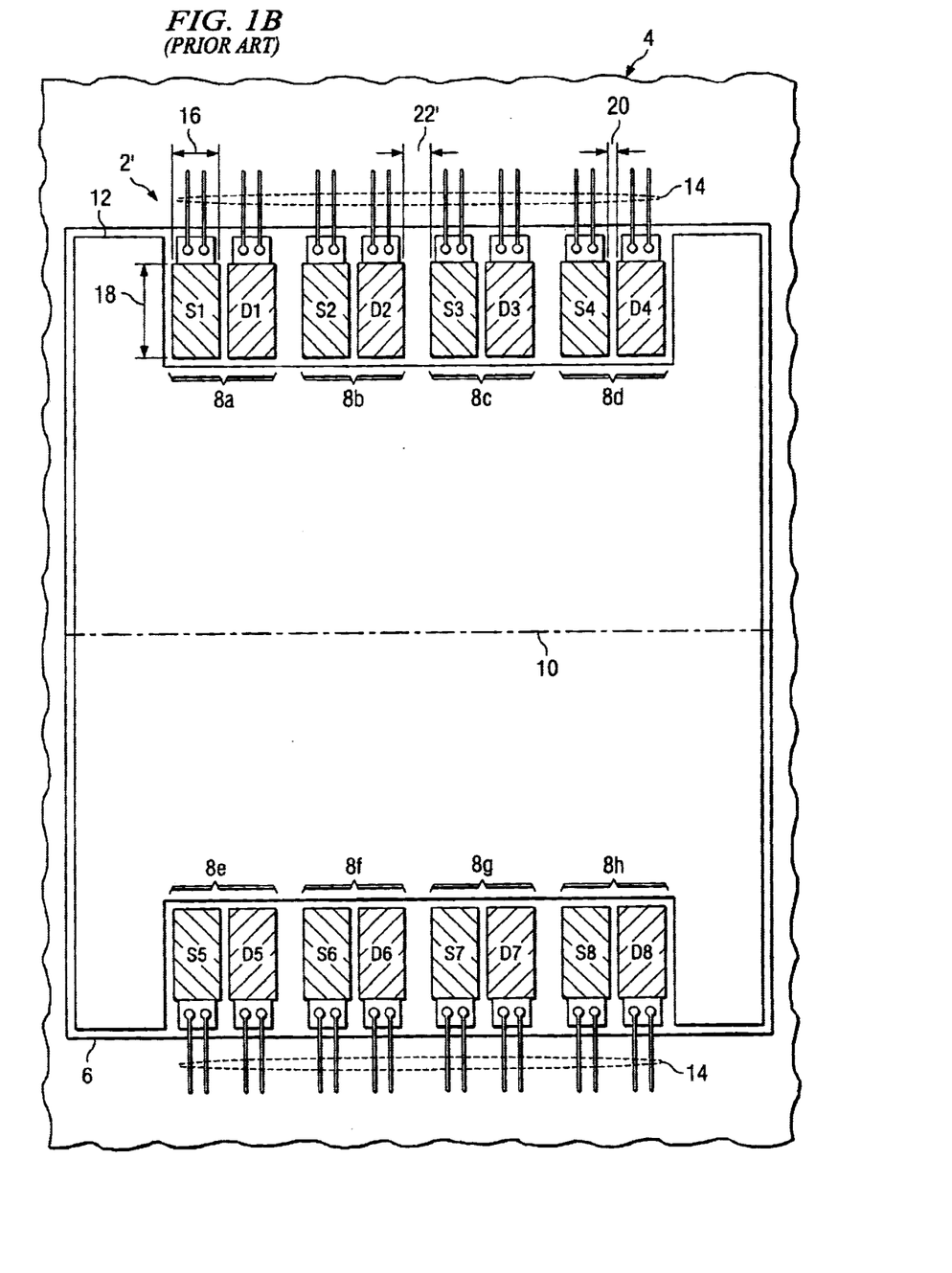
FIG. 1B is a top plan view illustrating an alternate solenoid driver circuit having several single-segment power transistors.

In FIG. 1B, an alternative driver device 2' is illustrated, wherein the LDMOS transistors 8 have been spaced from one another by a larger distance 22'. However, as the transistors 8 are spaced further from one another, the area 12 in which other circuit devices are formed is reduced. In addition, it has been found that the area of unitary (e.g., unsegmented) LDMOS and other type power transistors, such as transistors 8 can only be reduced slightly by adjusting the spacing as in FIG. 1B. Thus, designers are often forced to oversize the transistors 8 beyond the area required to meet Rdson specifications, in order to achieve SOA specifications, thereby reducing the area available for other circuitry in the device 2. Thus, there is a need for power electronic devices and methods by which improved space utilization can be achieved and which facilitate smaller power transistors able to meet Rdson and SOA specifications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

According to one aspect of the invention, transistors are provided, in which the transistor is segmented into two or more transistor segments having segment sizes or areas determined according to a safe operating area (SOA) specification for the device, which are then coupled to form a segmented transistor device. The transistor segments themselves may be further partitioned, such as comprising two or more partitioned source and drain diffusion areas or cells in the wafer. This aspect of the invention may be employed in association with LDMOS and other MOS type devices to facilitate improved space utilization and/or reduced device sizes, while achieving performance and safe operating specifications. In this regard, the various aspects of the invention may be practiced to effectively reduce the total power transistor device areas below that required for equivalent unitary (e.g., non-segmented) devices. In other implementations, the invention may be employed to provide transistors of the same or similar size or area, which have higher power handling capabilities than similarly sized non-segmented transistors.

In another aspect of the invention, the transistor segments are spaced from one another according to a pulse time specification for the device. This may be employed, for example, to provide thermal diffusion distance in the substrate between adjacent segments, through which heat is removed from the device to reduce the likelihood of thermal damage or failure during operation. In still another aspect, other electrical devices may be formed in the spaces between the power transistor segments, in order to better utilize the total area of the device die. For example, in a solenoid driver device, logic and/or low power analog circuitry such as transistors, memory cells, resistors, capacitors, diodes, or the like, may be located between the spaced power transistor segments in the substrate. Thus, in addition to facilitating reduction in the total transistor area, the invention facilitates improved space utilization (e.g., higher device density) throughout the device, by which more circuitry may be provided in a given die area, and/or by which die areas may be reduced.

Yet another aspect of the invention provides methodologies and techniques for fabricating high power MOS transistors, such as LDMOS and other devices, in which first and second transistor segments are formed in a substrate with segment areas determined according to a safe operating area specification for the transistor, and wherein the second transistor segment is spaced in the substrate from the first transistor segment based on a pulse time specification. Segmented transistors having any integer number N of such transistor segments may be thus fabricated in accordance with the methods of the invention, wherein the transistor segments may themselves be partitioned to include two or more source and drain diffusion regions or cells generally underlying the metalization structures for the transistor segments. The transistor segments individually comprise a source metalization segment, a drain metalization segment, and a gate segment, which are coupled with source, drain, and gate structures, such as pads or other conductive features. The methodologies may further comprise formation of other electrical devices in the spaces between transistor segments, for instance, to facilitate improved space utilization/device density in semiconductor devices such as solenoid and other driver integrated circuits.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. Several implementations of the various aspects of the invention are hereinafter illustrated and described in the context of LDMOS devices in solenoid driver circuits. However, it will be appreciated that the invention is not limited to such devices, and that the various aspects of the invention may be carried out in conjunction with any type of power semiconductor device and any type of transistor.

Referring to FIGS. 2A–6, one example of a segmented LDMOS power transistor 100 is illustrated in a driver device 102 in accordance with the invention. The invention contemplates segmented transistor devices having any integer number N transistor segments, one some or none of which may be individually partitioned to comprise multiple source and drain diffusion regions, '$s_i$' and '$d_i$', and polysilicon gate structures $g_i$, respectively, wherein the gate structures $g^i$ are formed around the source structures $s_i$ as illustrated in FIG. 2B. The exemplary transistor 100 comprises ten such segments 104a–104j, spaced from one another by a thermal diffusion distance 106 in a substrate 108, based on a pulse time specification for the segmented transistor. The invention further contemplates formation of other electrical devices in spaces between power transistor segments 104, whether spaced according to pulse time specifications or other criteria, as illustrated and described in greater detail below.

Figure 2A:
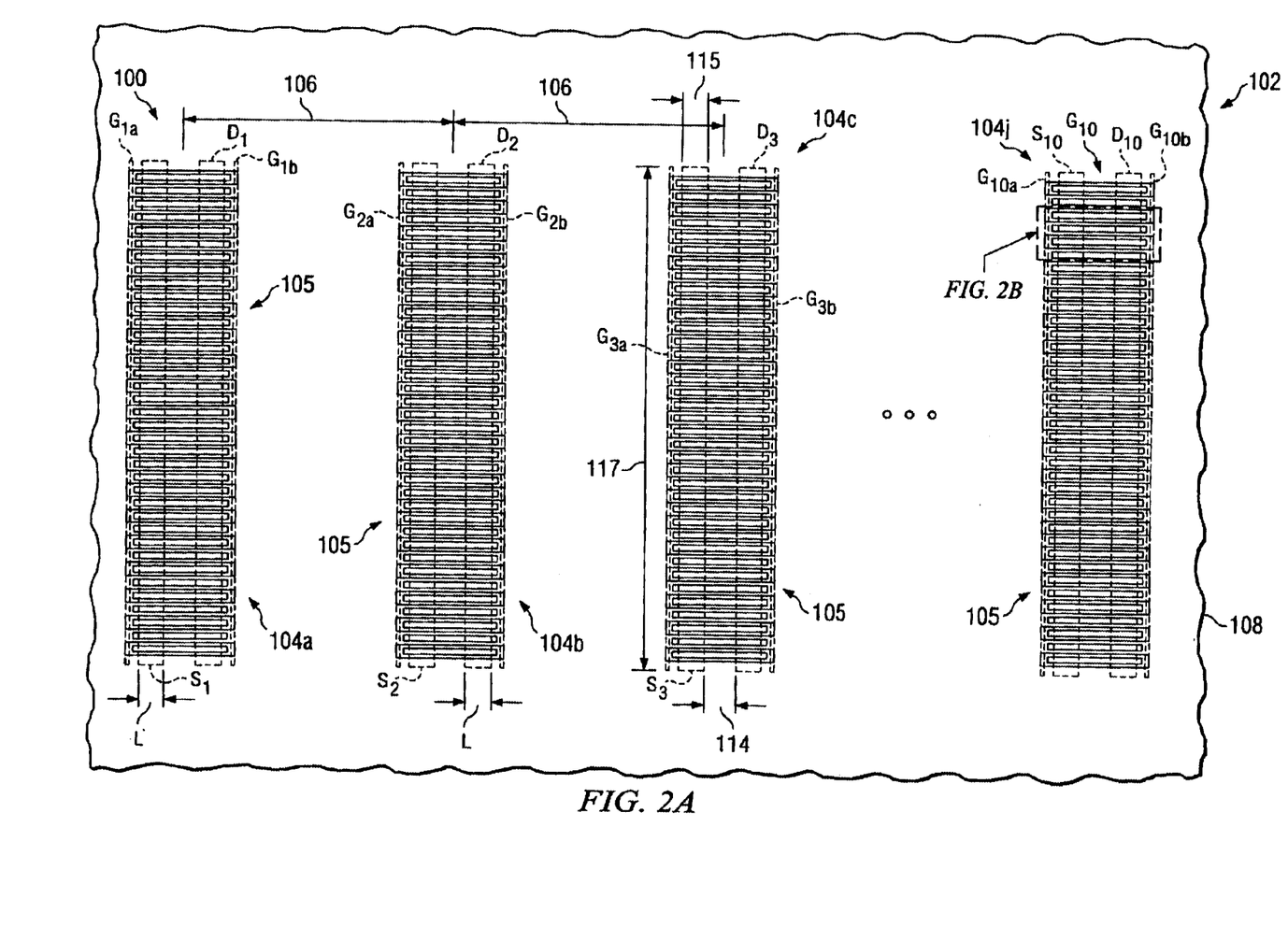
FIG. 2A is a partial top plan view illustrating an exemplary semiconductor device having a segmented transistor with spaced transistor segments in accordance with an aspect of the invention.

The transistor segments 104 individually comprise a source metalization segment $S_n$, a drain metalization segment $D_n$, and gate segments $G_{na}$ and $G_{nb}$ (illustrated in dashed line in FIGS. 2A and 2B), which are coupled to one another to form a segmented transistor device 100. The segments 104, thus individually comprise a plurality of partitioned transistor sub-segments 105, as illustrated in FIG. 2A. The source and drain metalization segments $S_n$ and $D_n$, respectively, are spaced from one another by a distance 114 and are of substantially similar lengths 115 and widths 117. As used herein, segments refers to the metalization layer features as well as the unitary or partitioned gate and source/drain diffusion regions thereunder, unless otherwise specified. For example, the first transistor segment 104a comprises a source metalization segment $S_1$, a drain metalization segment $D_1$, and gate metalization segments $G_{1a}$ and $G_{1b}$ under which are a plurality of source and drain diffusion regions doped with impurities in the substrate 108, as well as polysilicon gate structures encircling the source diffusion regions.

Figure 2B:
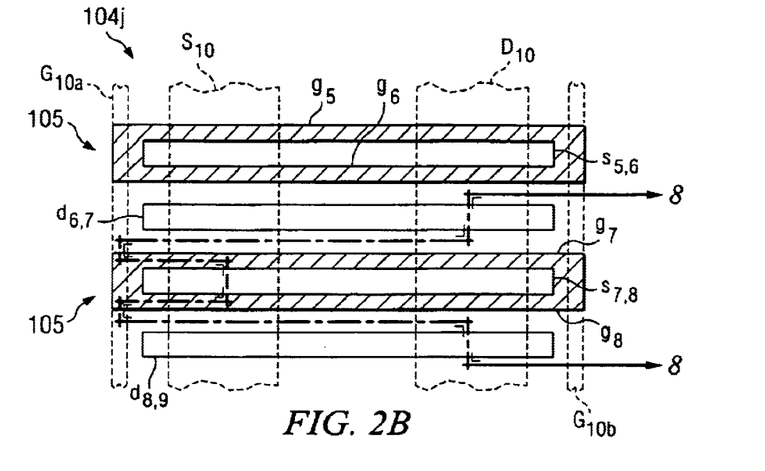
FIG. 2B is a partial top plan view illustrating exemplary partitioned source, drain, and gate regions in one of the transistor segments of the segmented transistor in FIG. 2A.

FIG. 2B illustrates a portion of the tenth stage 104j, showing source diffusion regions $S_{5,6}$, a polysilicon gate $g_6$ formed around the source diffusion region $S_{5,6}$, a drain diffusion region $d_{6,7}$, a gate $g_7$ formed around a source diffusion region $S_{7,8}$, and a drain diffusion region $d_{8,9}$ underlying prospective source, drain, and gate metalization regions $S_{10}$, $D_{10}$, and $G_{10a}$ and $G_{10b}$, respectively. In the illustrated example, of FIGS. 2A and 2B, the gate metalization structures $G_{10a}$ and $G_{10b}$ are electrically connected with the lateral ends of the gates g7 and g8, the source metalization structure $S_{10}$ is connected with the source diffusion regions $S_{5,6}$ and $S_{7,8}$, and the drain metalization structure D10 is connected to the drain diffusion regions $d_{6,7}$ and $d_{8,9}$. The transistor segments 104, moreover, individually comprise a segment area determined according to a safe operating area (SOA) specification for the transistor 100, being roughly the product of the width 117 times the sum of 2 times the source/drain segment lengths 115 plus the length 114.

Figure 3:
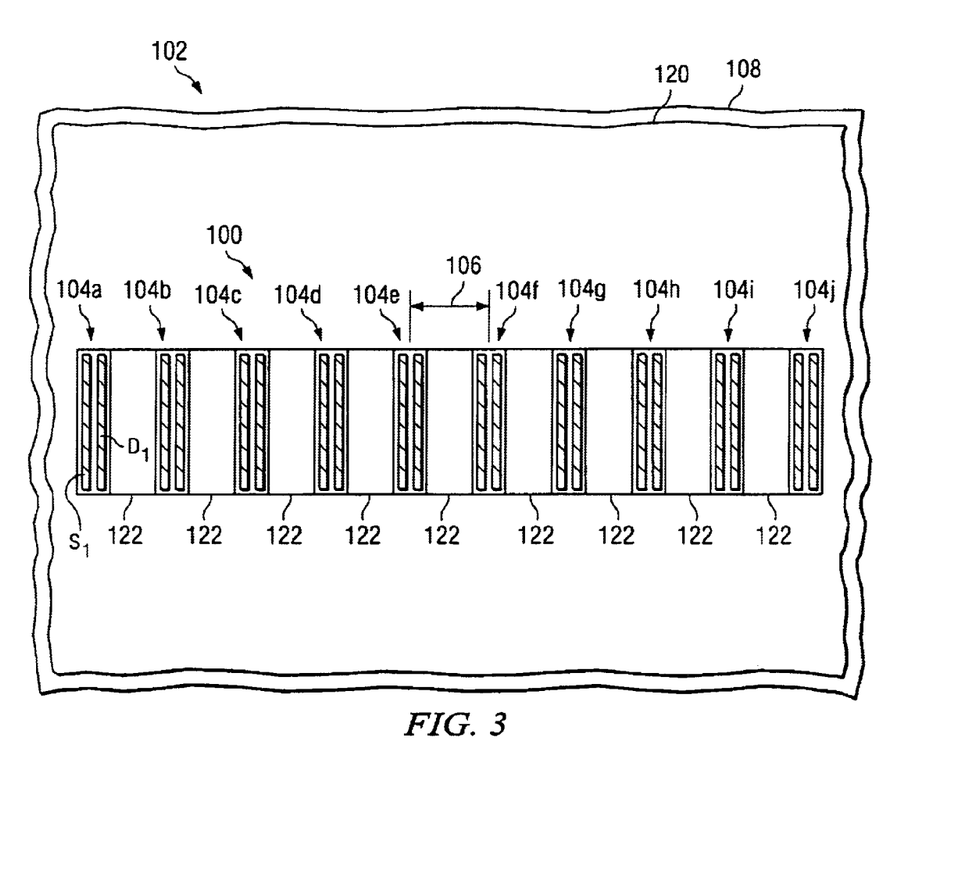
FIG. 3 is a top plan view further illustrating the segmented transistor of FIG. 2 and regions between transistor segments in which other circuitry may be formed therein in accordance with another aspect of the invention.

FIGS. 2A–6 provide simplified views of the exemplary device 102 in various intermediate stages of fabrication, wherein the structures illustrated herein are not necessarily drawn to scale, and certain details are omitted so as not to obscure the various aspects of the invention. FIG. 3 illustrates the ten segments 104a–104j of the exemplary segmented LDMOS transistor 100, wherein the transistor 100 occupies ten times the segment area thereof in the wafer substrate 108. It is noted at this point, that while the exemplary transistor 100 comprises segments 104 of substantially similar or equal size, shape, and area, that other implementations are possible within the scope of the invention wherein segments of differing areas, sizes, and/or shapes can be employed.

Also illustrated in FIG. 3 is a remaining area or region 120 available for fabrication of other electrical devices in the substrate 108, including regions 122 (illustrated in dashed line in FIG. 3) between the ten transistor segments 104a–104j. For example, other devices such as transistors, memory cells, diodes, resistors, capacitors and other devices can be fabricated in the gap regions 122 and/or in the other available area 120. In the exemplary solenoid driver implementation, for example, logic, memory, and/or low power analog circuit elements may be formed in and on the substrate 108 in the regions 120 and 122. Thus, in addition to reduction in the total transistor area, the invention contemplates the use of the gaps 122 between transistor segments 104a–104j (e.g., and thus between the underlying source diffusion region $s_i$, gates $g_i$, and drain diffusion regions $d_i$ for device formation and/or interconnect routing, so as to facilitate improved space utilization and/or device density. This, in turn, may facilitate addition of more circuitry in a given device die size, and/or total die size reduction. It will be appreciated that any device structures can be formed in the regions 120 and/or 122, wherein the substrate 108 in these regions is also used to diffuse heat from the transistor segments 104.

Figure 4:
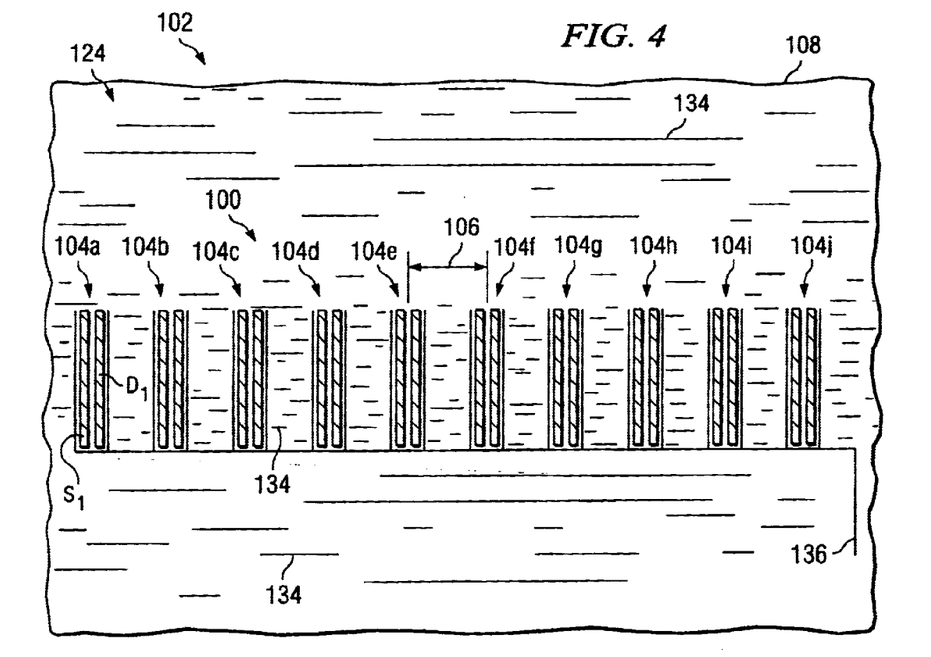
FIG. 4 is a top plan view illustrating a first interconnect layer in the device of FIGS. 2 and 3.
Figure 5:
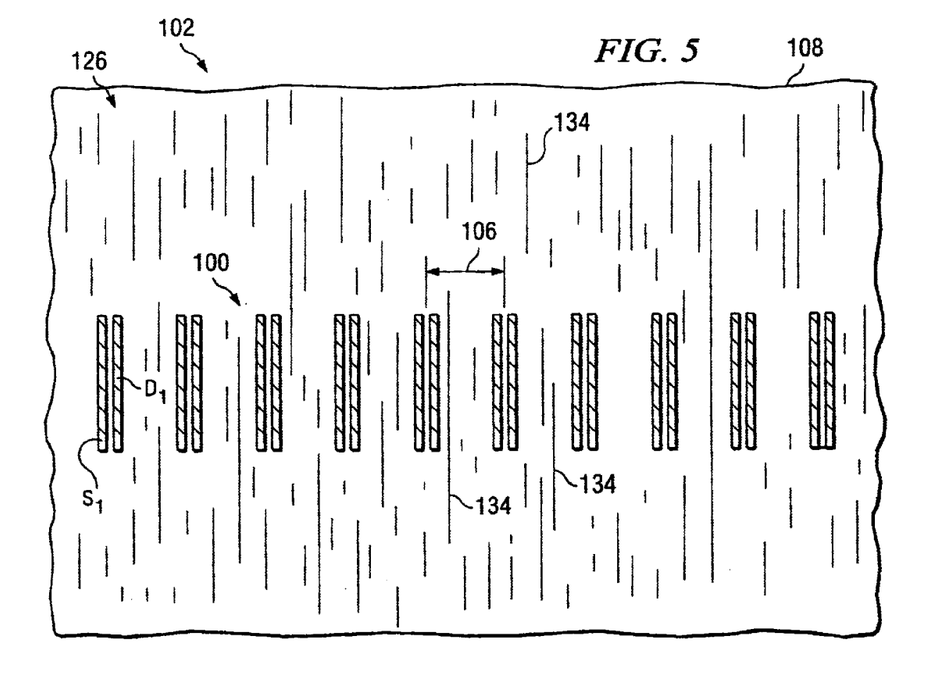
FIG. 5 is a top plan view illustrating a second interconnect layer in the device of FIGS. 2–4.
Figure 6:
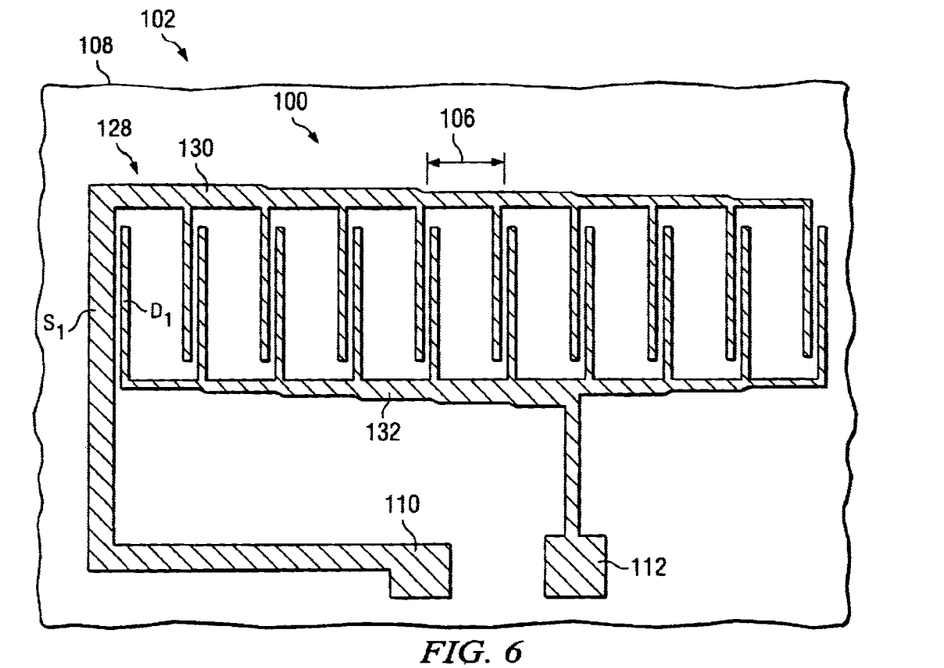
FIG. 6 is a top plan view illustrating an exemplary upper or top interconnect layer in the device of FIGS. 2–5.

FIG. 4 illustrates the device 102 with a first metalization or interconnect layer 124 formed thereon, FIG. 5 shows the device 102 after formation of a second interconnect layer 126, and FIG. 6 illustrates a final or upper interconnect layer 128 formed over the intermediate interconnect layers 124 and 126. As shown in FIG. 6, the source metalization segments $S_1$–$S_{10}$ are coupled to one another and to a source pad 110 via a conductive source routing structure 130 in the upper layer 128, such as aluminum or copper. It will be appreciated that the source metalization segments $S_1$–$S_{10}$ and the drain metalization segments $D_1$–$D_{10}$ are formed in the various interconnect layers overlying the diffused source and drain sub-segments in the substrate 108, and that the structures illustrated in FIGS. 4–7 of the present example include metalization structures formed over and electrically coupled with these sub-segments, wherein the source metalization structures $S_1$–$S_{10}$ and the drain metalization structures $D_1$–$D_{10}$, are widthwise generally coextensive with the plurality of underlying partitioned source diffusion sub-segments or regions $s_i$ and the drain diffusion sub-segments $d_i$.

The drain metalization segments $D_1$–$D_{10}$ are coupled to one another and to a drain pad 112 via a conductive drain routing structure 132 in the layer 128. Because the gate metalization segments $G_n$ typically conduct far less current than the source and drain metalization segments $S_n$ and $D_n$, the gate metalization segments $G_n$ are connected to one another in the intermediate interconnect layer 124 (FIG. 4) via a routing line 136, and may be coupled with other electrical devices (e.g., logic and/or low power analog circuits) in the driver 102. For example, such other circuitry may be used to selectively activate the transistor 100. However, alternatively, a gate pad (not shown) could be provided in the upper layer 128 (FIG. 6), such as where external connection to the gate of the transistor 100 is desired.

It is further noted from FIGS. 4 and 5 that conductive interconnect lines 134 may be routed in the areas 122 between the transistor metalization segments 104 in accordance with the invention, to provide interconnection to electrical devices formed therein and/or to provide improved routing options in the overall device 102. Thus, in addition to providing improved space utilization, the invention may be advantageously employed to facilitate higher density interconnecting routing schemes, possibly allowing reduction in the number of interconnect layers and the associated cost and processing time in the manufacture of devices such as the driver 102.

Figure 7:
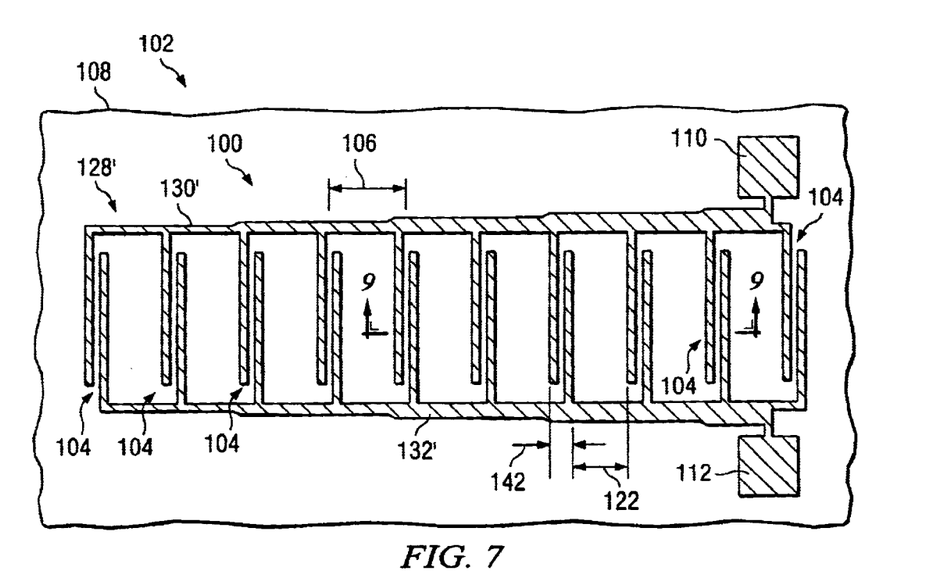
FIG. 7 is a top plan view illustrating another exemplary upper interconnect layer in the device of FIGS. 2–5.

Referring also to FIG. 7, an alternate top layer 128' is illustrated having shorter length routings 130' and 132' for the source and drain metalization segments $S_n$ and $D_n$, respectively, to the pads 110 and 112. It will be noted at this point that the invention is not limited to the transistor metalization segments 104 and the underlying partitioned transistor diffusion regions, and/or the relative spacings thereof which are illustrated and described herein. For example, the segments 104 need not be of the same size, shape, or area, and need not be linearly aligned as in the illustrated implementations. Furthermore, other electrical devices (e.g., transistors, memory cells, diodes, resistors, capacitors and others) may, but need not, be fabricated between all or any adjacent transistor segments. In addition, the exemplary source and drain metalization segments $S_n$ and $D_n$, respectively, may be coupled with one another in a final or top interconnect layer, or may be coupled by other routings apart from those illustrated in the exemplary device 102. Thus, it will be appreciated by those of ordinary skill in the art that all such alternatives and modifications are contemplated as falling within the scope of the invention and the appended claims.

Figure 8:
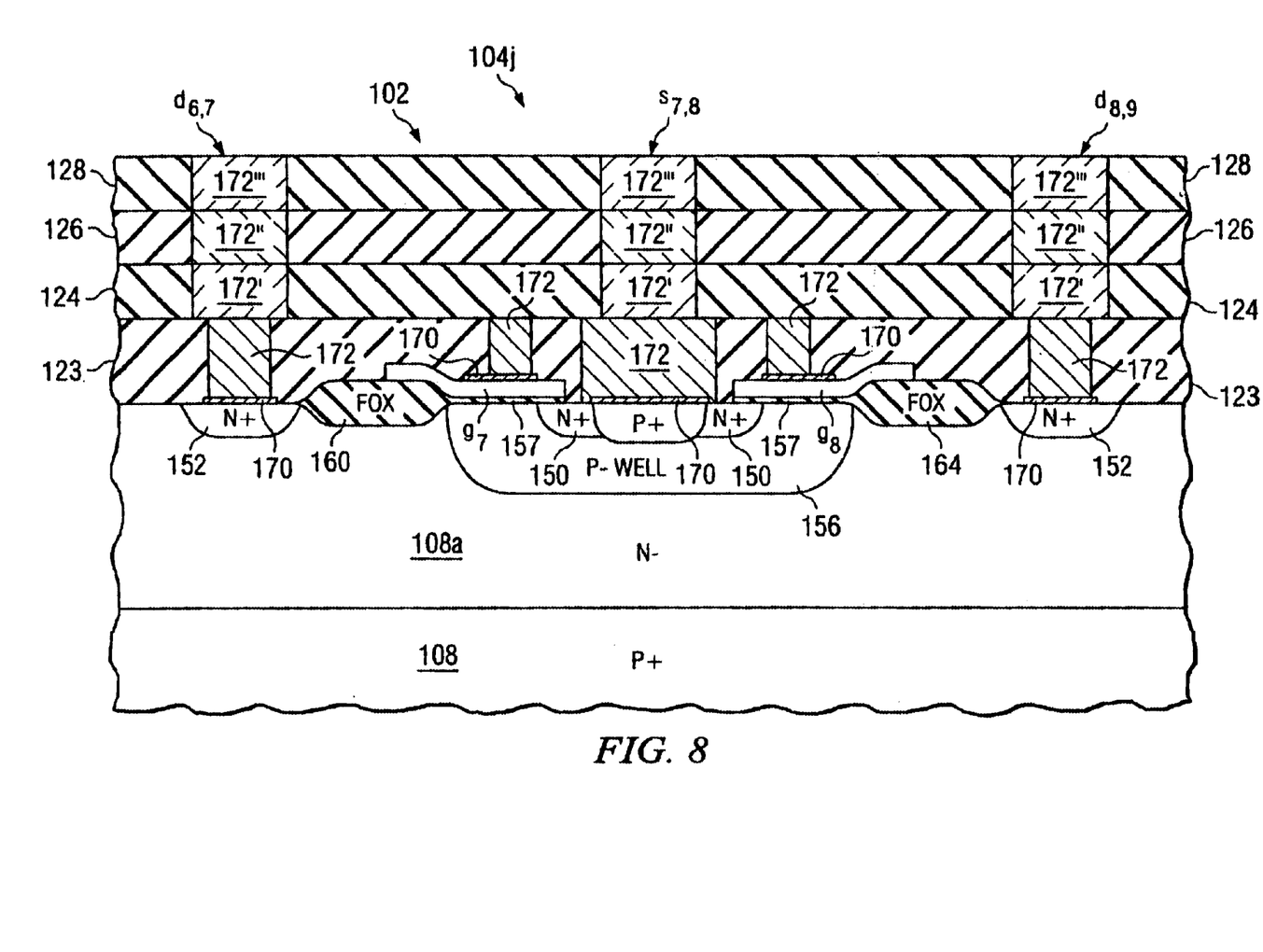
FIG. 8 is a side elevation view of the device of FIGS. 2–7 taken along line 8—8 of FIG. 2B.
Figure 9:
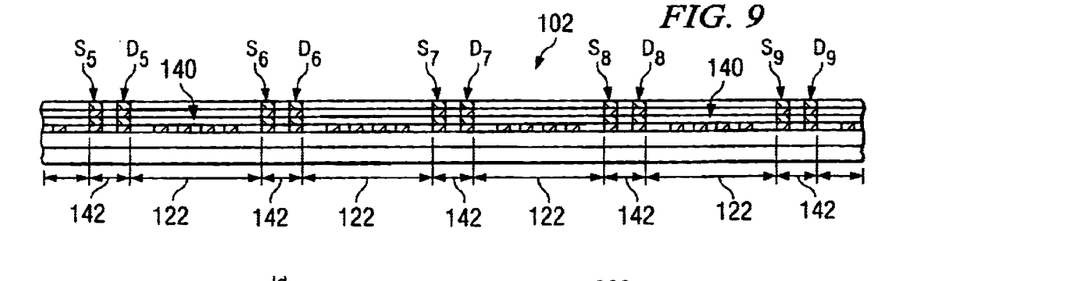
FIG. 9 is a side elevation view of the device of FIGS. 2–8 taken along line 9—9 of FIG. 7.

FIGS. 8 and 9 provide sectional side views taken along lines 8—8 and 9—9, respectively, of FIGS. 2B and 7, respectively, which further illustrate the formation of electrical devices such as low power transistors 140 in the spaces 122 between the areas 142 occupied by the transistor segments 104. In FIG. 8, one particular portion of a partitioned transistor segment 104j of the exemplary LDMOS transistor 100 is illustrated, comprising an n+ source 150 corresponding to $S_{7,8}$, n+ drains 152 corresponding to sub-segments $d_{6,7}$, and $d_{8,9}$, and polysilicon gates $g_7$ and $g_8$, wherein channels extends in a p-type body 156 between the n+ sources 150 and the drains 152. The p-type body 156 is diffused within an n- drift region 108a in the p-type substrate 108, and the n+ sources 150 are formed in the p-type body 156. Field oxide (FOX) structures 160 and 164 are formed between the p-type body 156 and the drains 152, such that high electric fields can form between the drain 152 and the source 150 for improved breakdown performance. In addition, the FOX structures 160 and 164 extend partially under polysilicon gate structures $g_7$ and $g_8$, the remainder of which overly thin gate oxide layers 157, which in turn overly the channels in the p-type body 156.

The low power transistors 140 of FIG. 9 are MOSFET devices individually comprising source and drain regions outlying a channel, over which a polysilicon gate is formed according to known processing techniques, wherein the component structures of the devices 140 are not numerically referenced in the drawing figures. Silicide regions 170 are formed over the gates g, the source diffusion regions 150, and the drain diffusion regions 152 of the transistor segment 104g, and conductive contacts 172 are formed in a first metalization layer of inter-layer dielectric (ILD) material 123, wherein the contacts 172 connected to the sources 150 and the drains 152 are relatively wide to accommodate large drain currents. Contacts (not numerically referenced) are also formed to provide connection through the layer 123 to the drains, sources, and gates of the smaller transistors 140 in FIG. 9. Further interconnect layers 124, 126, and 128 are formed providing interconnection routing layers for connecting various devices 140, as well as for connecting the LDMOS sub-segment gates $g_7$ and $g_8$. Fairly large conductive metalization segments or structures 172', 172'', and 172''' are also formed in the layers 124, 126, and 128, respectively, to provide connection of the sources 150 and the drains 152 to the upper layer 128.

Figure 10:
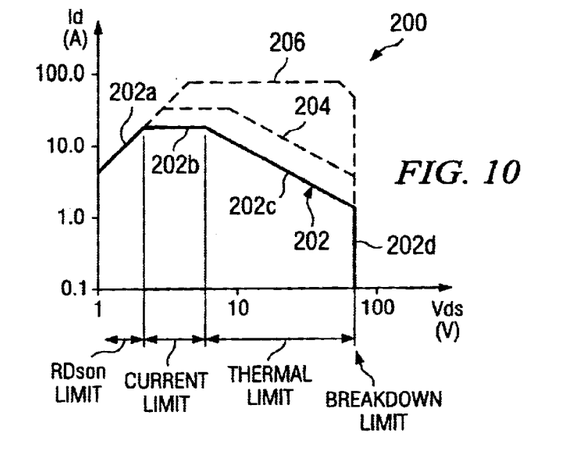
FIG. 10 is a graph illustrating exemplary safe operating area specifications for drain current versus drain-source voltage for various pulse times and DC.
Figure 11:
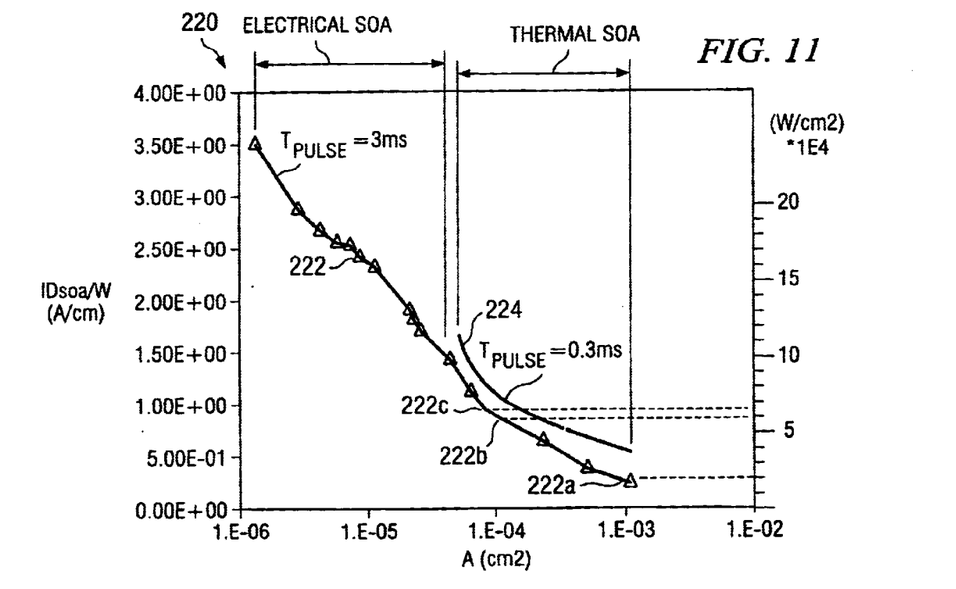
FIG. 11 is a graph illustrating safe operating area limits for power density as a function of area for an LDMOS device in accordance with the invention.
Figure 12:
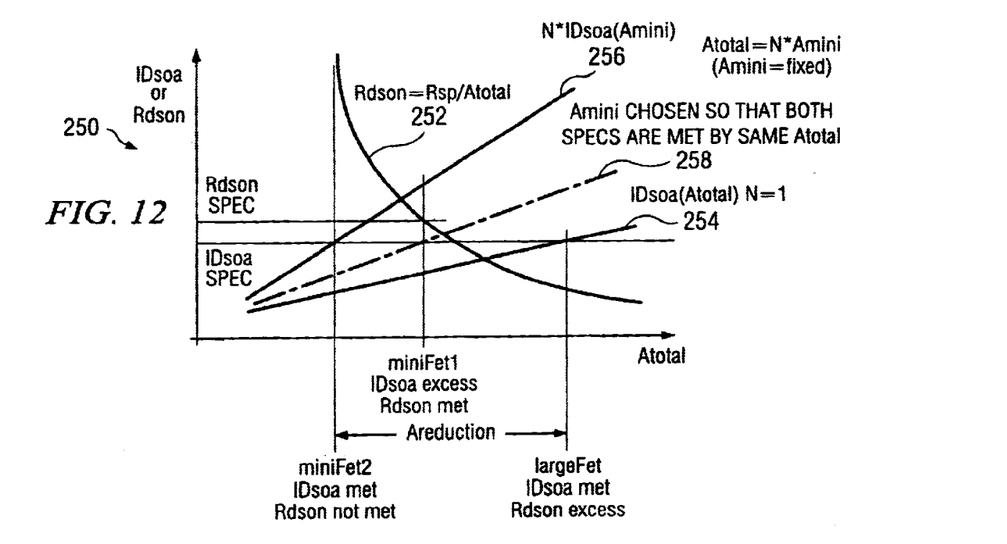
FIG. 12 is a graph illustrating the relationship of drain current and Rdson as a function of device area in accordance with the invention.

Referring also to FIGS. 10–12, the sizing and spacing of the transistor segments 104 in the exemplary segmented transistor 100 are done according to SOA and pulse time specifications for the transistor 100. FIG. 10 provides a simplified graph 200 of safe operating area specifications for drain current Id versus drain-source voltage Vds for various pulse times and DC. FIG. 11 provides a graph 220 illustrating power density (W/cm$^2$) and safe operating area drain current (IDsoa) as a function of area (cm$^2$) for an LDMOS device in accordance with the invention. FIG. 12 provides a graph 250 illustrating the relationship of drain current (IDsoa) and drain to source resistance in the on state (Rdson) as a function of device area (cm$^2$) in accordance with the invention.

Failure in power MOSFET transistors can result from excessive current or voltage. The graph 200 in FIG. 10 illustrates an exemplary SOA characteristic curve 202 for a MOSFET device in a plot of drain current Id versus drain-to-source voltage Vds for DC. Also illustrated are exemplary curves 204 and 206 corresponding to periodic pulses of power at 3 ms and 0.3 ms pulse times, respectively. The DC curve 202 includes four basic regions 202a–202d, related to Rdson limits, current limit, thermal limit, and breakdown limit, respectively. The first region 202a is referred to as an Rdson limit region, wherein the drain to source voltage Vds and the drain current Id are defined by the resistance of the drain-to-source path Rdson.

The second region 202b is where the safe operating area is determined by the current-carrying capability of the bond wires and surface metalization of the die, sometimes referred to as the current limit region or package limit region. In this region 202b, the allowable currents are time-dependent, wherein higher currents may be conducted for shorter durations, as seen from the curves 204 and 206. The third region 202c is known as a thermal limit region or a power limit region, wherein power dissipation can cause the junction temperature $T_J$ of the device to increase to a maximum allowable value $T_{Jmax}$. As with the region 202b, the allowable currents in the thermal limit region 202c are time-dependent. In the breakdown region 202d, the breakdown voltage of the device is reached, wherein exceeding this voltage, even for short time durations, can cause device failure.

The graph 220 of FIG. 11 illustrates an exemplary curve 222 of the electrical and thermal safe operating area limits for an LDMOS device, at a drain to source voltage Vds of 50 volts for different areas (power density versus area), with a pulse time specification of 3 ms, and another curve 224 in the thermal SOA region for a pulse time specification of 0.3 ms. FIG. 12 illustrates a graph 250 of the relationship of drain current and Rdson as a function of device area in accordance with the invention, wherein the drain current at which the safe operating area specification is met is illustrated as IDsoa versus total transistor device area. A curve 252 in FIG. 12 shows an exemplary Rdson specification, and first, second, and third transistor design performances are represented by three lines 254, 256, and 258, respectively.

With respect to the curve 222 in FIG. 11 for a 3 ms pulse time specification, the inventors have found that the total area of a segmented LDMOS device can be made smaller than the total area of a unitary (e.g., unsegmented) device of similar performance specifications. Alternatively, a segmented device of similar total area can be fabricated having higher power handling capabilities. In one example, a unitary device having an area of 1E-3 cm$^2$ would have an SOA limit at a point 222a on the curve 222 corresponding to a power density of about 2E4 W/cm$^2$. Such a device, therefore, could provide about 20 watts of power (e.g., at Vds=50 volts) without exceeding the SOA area specification for a pulse time of 3 ms (2E4 W/cm$^2$*1E-3 cm$^2$=20 W). This design corresponds to the first line 254 in FIG. 12, wherein the IDsoa specification is met, but the Rdson of the device is much less than the Rdson specification. Thus, it is seen that the conventional unitary LDMOS design (e.g., FIG. 1) can result in designers being forced to oversize the device (total area) to provide safe operating area for a given Rdson specification.

However, for a segmented device comprising ten transistor segments of about 1E-4 cm$^2$ (e.g., having the same total area of 10*1E-4 cm$^2$=1E-3 cm$^2$ as the unitary device), about 60 W of power can be achieved. In this example, the area of each transistor segment has a SOA specification at point 222b of the curve 222 of FIG. 11, corresponding to about 6E4 W/cm$^2$, and illustrated as line 256 in FIG. 12. This example of a segmented transistor having ten such segments could provide about 60 watts of power without exceeding the segments SOA area specification for a pulse time of 3 ms (6E4 W/cm$^2$*10 segments*1E-4 cm$^2$/segment=60 W). Thus, it is seen that by segmenting the device, more power capacity can be achieved for the same total transistor area, wherein the safe operating area (IDsoa) specification is met, with a significant excess in Rdson capability (e.g., Rdson is less than it needs to be).

In another example, a segmented device may be designed to meet the same power specification (e.g., about 20 watts at Vds=50 volts, pulse time=3 ms) as that of the example unsegmented device, shown as the third design line 258 in FIG. 12, without significantly exceeding the Rdson specification. For instance, using a transistor segment area of 1E-4 cm$^2$ (point 222b in the graph 220), with a total N=4 segments, the device could provide about 24 watts of power without exceeding the SOA area specification for a pulse time of 3 ms (6E4 W/cm$^2$*4 segments*1E-4 cm$^2$/segment= 24 W). In this case, the total device area (4E-4 cm$_2$) is significantly less than that of the unitary device (1E-3 cm$^2$). Alternatively, four segments having areas of about 8E-5 cm$^2$ could be used, wherein each such segment has a SOA specification at a point 222c in the graph 220, corresponding to a power density of about 6.6E4 W/cm$^2$. In this alternate segmented transistor design, a power handling capability of about 21 watts could be achieved at Vds=50 volts and $T_{PULSE}$=3 ms without exceeding the SOA area specification of the curve 222 (e.g., 6.6E4 W/cm$^2$*4 segments*8E-5 cm$^2$=21 W).

Thus, in accordance with an aspect of the invention, segmentation of a power transistor, such as an LDMOS, may be employed to reduce the total transistor area compared with non-segmented (e.g., unitary) implementations, allowing the safe operating area specification to be met, without having to oversize the device. This can be used to implement higher power devices in the same area, and/or to implement devices having the same power handling capability in a smaller die area. In this regard, the inventors have appreciated that conventional LDMOS solenoid driver designs (e.g., FIG. 1A) have been limited in power density by essentially one-dimensional heat flow to a range of about 2E4 to 3E4 W/cm$^2$, corresponding to a critical temperature of about 600 to 800 degrees K.

The inventors have appreciated that while smaller devices fail at approximately the same critical temperature, higher power densities can be achieved because of multi-dimensional heat flow. Thus, the inventors have found that for the same total area, segmented device power densities can be as much as 1.5 to 10 times that of unitary devices, allowing increased power handling capabilities in the same die area. In addition, it has been found that whereas conventional driver device designs typically had to oversize the power transistor devices in order to meet a given Rdson specification and safe operating are considerations, the present invention allows designs to be optimized for Rdson without sacrificing area to meet SOA specifications.

Alternatively or in combination, the invention facilitates the addition of more auxiliary electrical devices to an integrated circuit by reducing the total area occupied by the power devices. It is noted, in this regard, that the invention provides for any transistor segment area, including non-rectangular shapes, as well as for segmented transistors having segments of non-equal area, and different shapes. Thus, it will be appreciated that segmented power devices are possible within the scope of the invention, which exactly meet a desired power specification, while using minimal total die area for the device. In addition, it will be noted that other designs are possible within the scope of the invention using any pulse time specifications, power ratings, etc., and which employ other types of power transistor devices, including but not limited to LDMOS and other MOS devices.

In another aspect of the invention, these goals may be further facilitated by allowing the space between power transistor segments to be used for other electrical devices, such as transistors, memory cells, resistors, diodes, capacitors, etc. Thus, in FIG. 3 above, the regions 122 may include such devices. The spacing of the transistor segments, such as the exemplary spacing 106 in FIGS. 2–9 above, may advantageously be determined according to a pulse time specification for the device. In one example, the diffusivity of the substrate material 108 is used along with the pulse time specification $T_{PULSE}$ to determine a minimum spacing distance for the transistor segments 104. For silicon, this thermal diffusivity constant is approximately 0.5 cm/s. Using the above example of a pulse time of 3 ms, a thermal diffusion distance $L_{diff}$ could be calculated as $L_{diff}$=(0.5 cm/s*3 ms)$^{1/2}$=387 um. For a pulse time specification of 2.5 ms, $L_{diff}$ could be calculated as $L_{diff}$=(0.5 cm/s*2.5 ms)$^{1/2}$= 354 um. For a pulse time specification of 1.8 ms, $L_{diff}$ could be calculated as $L_{diff}$=(0.5 cm/s*1.8 ms)$^{1/2}$=300 um.

In one implementation of this aspect of the invention, the spacing or pitch 106 of the linearly disposed transistor segments 104 in the device 100 is determined as the thermal diffusion distance or length $L_{diff}$. It will be appreciated that the spacing facilitates multi-dimensional heat diffusion from the heat generating transistor segments 104, and that spacings 106 higher than this thermal diffusion distance are possible within the scope of the invention. Thus, for example, the spacing could be set according to other design criteria, such as to facilitate formation or grouping of other electrical components in the regions 122 (FIG. 3) between transistor segments 104, wherein the thermal diffusion distance $L_{diff}$ is used as a minimum value.

Furthermore, it will be appreciated that the spacings between all transistor segments need not be the same. In addition, some segments may be spaced according to a pulse time specification, for example, such as a fraction of the thermal diffusion distance, wherein one or more other electrical components are formed therebetween in accordance with the invention. Alternatively or in combination, one or more other electrical components (e.g., transistors, memory cells, resistors, capacitors, diodes, or the like, may be formed between transistor segments which are spaced without regard to pulse time specifications or thermal diffusion distances derived therefrom in accordance with the invention.

Figure 13:
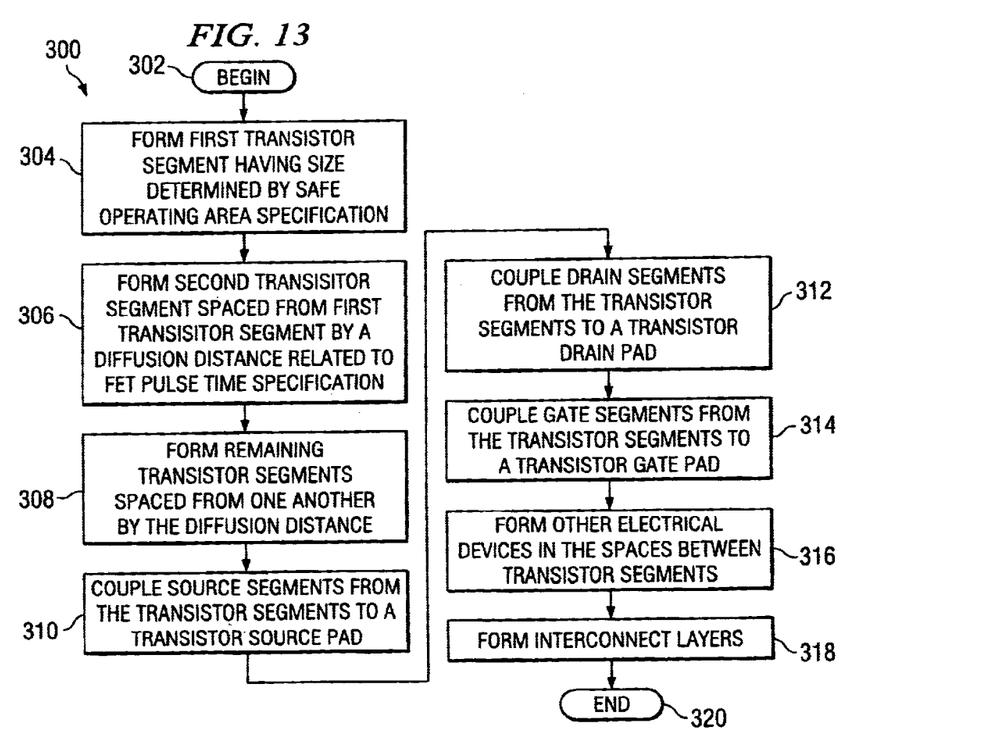
FIG. 13 is a flow diagram illustrating an exemplary method of fabricating semiconductor devices in accordance with another aspect of the invention.

Another aspect of the invention is illustrated in FIG. 13, wherein an exemplary method 300 is illustrated for fabricating a high power MOS transistor, such as the LDMOS devices illustrated described above and other power transistors. Although the exemplary method 300 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the transistor devices illustrated and described herein as well as in association with other structures not illustrated.

Beginning at 302, the exemplary method 300 and other methods according to the invention, comprise forming first and second transistor segments in a substrate having segment areas determined according to a safe operating area specification for the transistor, wherein the second transistor segment is spaced in the substrate from the first transistor segment based on a pulse time specification. The transistor segments individually comprise a source segment, a drain segment, and a gate segment, which are then coupled with source, drain, and gate structures, such as pads or other conductive features. Further, electrical devices, such as transistors, memory cells, resistors, capacitors, and the like, may be formed in the spaces between transistor segments.

At 304, a first transistor segment is formed in a substrate, such as the exemplary transistor segment 104a in FIG. 2, comprising a first source segment $S_1$, a first drain segment $D_1$, and a first gate segment $G_1$, which together comprise a first segment area or size determined according to a safe operating area specification. At 306, a second transistor segment is formed in the substrate (e.g., segment 104b above), which is spaced from the first transistor segment by at least a thermal diffusion distance, such as spacing 106 above, wherein the thermal diffusion distance is based on a pulse time specification. The second transistor segment also comprises a source segment, a drain segment, a gate segment, and a segment area determined according to the safe operating area specification. The segments and segment areas may, but need not be the same or similar. Further transistor segments may be formed at 308, spaced from one another by at least the thermal diffusion distance.

The source segments are coupled with a source pad or other conductive structure at 310, for example, such as the exemplary source pads 110 of FIGS. 6 and 7 above. This may be done to facilitate external connection of the source segments of the segmented transistor device, such as during device packaging. Likewise, the drain segments are coupled to a drain structure at 312, for example the drain pads 112 above. In addition, the gate segments are coupled to a gate structure at 314, which may, but need not, be a pad. Thus, for example, the gate segments may be interconnected to other circuitry in a device for control of the segmented transistor. In this regard, the coupling of the gate, source, and drain segments may be done at any level of interconnect structures or any other step in a manufacturing process in accordance with the invention. At 316, other electrical devices, such as low power transistors, memory cells, diodes, resistors, capacitors, or the like, may be formed in the substrate between at least two of the transistor segments, and interconnect layers are formed at 318, before the exemplary method 300 ends at 320.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of fabricating a high power MOS transistor, the method comprising:

forming a first transistor segment in a substrate, the first transistor segment comprising a first source segment, a first drain segment, and a first gate segment, wherein the first transistor segment comprises a first segment area determined according to a safe operating area specification for the high power MOS transistor;

forming a second transistor segment spaced in the substrate from the first transistor segment by at least a thermal diffusion distance, the second transistor segment comprising a second source segment, a second drain segment, and a second gate segment, wherein the second transistor segment comprises a second segment area determined according to the safe operating area specification, and wherein the thermal diffusion distance is based on a pulse time specification;

coupling the first and second source segments to a source structure;

coupling the first and second drain segments to a drain structure; and coupling the first and second gate segments to a gate structure.

2. The method of claim 1, wherein the first and second segment areas are substantially equal.

3. The method of claim 1, further comprising forming at least one electrical device in the substrate between the first and second transistor segments.

4. The method of claim 3, wherein forming the at least one electrical device comprises forming one of a low power transistor, a memory cell, a diode, a resistor, and a capacitor in the substrate between the first and second transistor segments.

5. A The method of claim 1, further comprising:

forming additional transistor segments to a total of N transistor segments, wherein N is an integer greater than 1, the individual transistor segments being spaced in the substrate from one another by at least the thermal diffusion distance and individually comprising a source segment, a drain segment, a gate segment, and a segment area determined according to the safe operating area specification;

coupling the source segments of the N transistor segments to the source structure;

coupling the drain segments of the N transistor segments to the drain structure; and coupling the gate segments of the N transistor segments to the gate structure.

6. The method of claim 5, wherein N=10.

7. The method of claim 5, further comprising forming at least one electrical device in the substrate between at least two of the N transistor segments.

8. The method of claim 7, wherein forming the at least one electrical device comprises forming one of a low power transistor, a memory cell, a diode, a resistor, and a capacitor in the substrate between at least two of the N transistor segments.

9. The method of claim 7, wherein the segment areas for the N transistor segments are substantially equal.

* * * * *